United States Patent
Yoda et al.

(10) Patent No.: US 6,927,468 B2
(45) Date of Patent: Aug. 9, 2005

(54) MAGNETIC RANDOM ACCESS MEMORY (75) Inventors: Hiroaki Yoda, Kawasaki (JP); Yoshiaki Asao, Yokohama (JP); Tomomasa Ueda, Yokohama (JP); Junichi Miyamoto, Yokohama (JP); Tatsuya Kishi, Yokohama (JP); Minoru Amano, Kawasaki (JP); Takeshi Kajiyama, Yokohama (JP); Hisanori Aikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 293 days.

(21) Appl. No.: 10/379,915

(22) Filed: Mar. 6, 2003

(65) Prior Publication Data

US 2004/0100818 A1 May 27, 2004

(30) Foreign Application Priority Data

Nov. 22, 2002 (JP) ........................................ 2002-340043

(51) Int. Cl.$^7$ .............................................. H01L 29/82
(52) U.S. Cl. ........................ 257/422; 257/295; 257/296; 257/421
(58) Field of Search ................................. 257/295, 296, 257/421, 422

(56) References Cited

U.S. PATENT DOCUMENTS

| 6,831,855 B2 | 12/2004 | Kishi et al. |
| 6,831,857 B2 | 12/2004 | Amano et al. |
| 2002/0034094 A1 | 3/2002 | Saito et al. |
| 2002/0109167 A1 | 8/2002 | Kang et al. |
| 2003/0161181 A1 | 8/2003 | Saito et al. |
| 2003/0186552 A1 | 10/2003 | Amano et al. |
| 2004/0021189 A1 | 2/2004 | Yoda et al. |
| 2004/0160855 A1 | 8/2004 | Saito et al. |
| 2005/0018478 A1 | 1/2005 | Nagase et al. |

FOREIGN PATENT DOCUMENTS

EP 1 120 790 8/2001

Primary Examiner—David Zarneke
Assistant Examiner—Douglas M. Menz
(74) Attorney, Agent, or Firm—Oblon, Spivak, McClelland, Maier & Neustadt, P.C.

(57) ABSTRACT

A write line is covered with a yoke material. The recording layer of an MTJ element is exchange-coupled to the yoke material. The total magnetic volume $\Sigma Msi \times ti$ of the recording layer of the MTJ element and a portion of the yoke material that is exchange-coupled to the recording layer is smaller than the magnetic volume $\Sigma Msi' \times ti'$ of the remaining portion of the yoke material that covers the write line.

28 Claims, 10 Drawing Sheets

FIG. 1 PRIOR ART

*1: Magnetic field strength is almost double
(Current for generating same magnetic field is 1/2)

⊗ represents magnetization direction of yoke material

F I G. 16

⊙ represents magnetization direction of yoke material

F I G. 19

MAGNETIC RANDOM ACCESS MEMORY

CROSS-REFERENCE TO RELATED APPLICATIONS

This application is based upon and claims the benefit of priority from the prior Japanese Patent Application No. 2002-340043, filed Nov. 22, 2002, the entire contents of which are incorporated herein by reference.

BACKGROUND OF THE INVENTION

1. Field of the Invention

The present invention relates to a magnetic random access memory (MRAM) with high write reproducibility and high write efficiency.

2. Description of the Related Art

Magnetic random access memories have been studied and developed as ultimate nonvolatile high-speed, large-capacity memories.

GMR (Giant Mangeto-Resistance) elements or MTJ (Magnetic Tunneling Resistance) elements are known as memory cells of magnetic random access memories. For data read, a memory using an MTJ element can ensure a larger signal amount than a memory using a GMR element. At present, magnetic random access memories using MTJ elements have enthusiastically been studied and developed.

Figure 1:
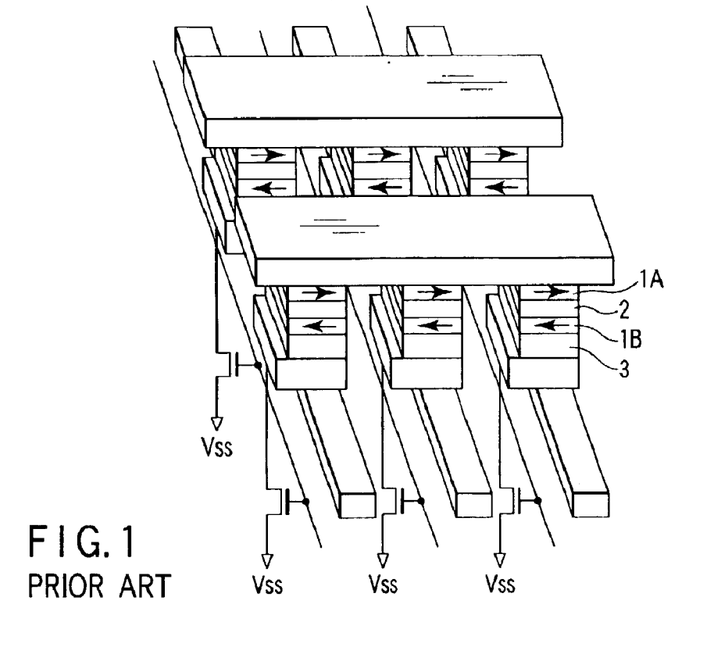
FIG. 1 is a perspective view showing a conventional magnetic random access memory.

FIG. 1 shows a cell array structure of a magnetic random access memory using an MTJ element.

The basic structure of the MTJ element is constituted by interposing an insulating layer (tunnel barrier) 2 between two magnetic layers (ferromagnetic layers) 1A and 1B. Cell data is determined by whether the magnetization directions of the two magnetic layers 1A and 1B are parallel or antiparallel. "Parallel" means that the magnetization directions of the two magnetic layers 1A and 1B are the same, and "antiparallel" means that the magnetization directions of the two magnetic layers 1A and 1B are opposite to each other.

An antiferromagnetic layer 3 fixes the magnetization direction of the magnetic layer 1B. The magnetic layer 1B whose magnetization direction is fixed is called a fixed layer or pinned layer. The magnetic layer 1A whose magnetization direction changes depending on the magnetic field is called a recording layer or free layer.

Figure 2:
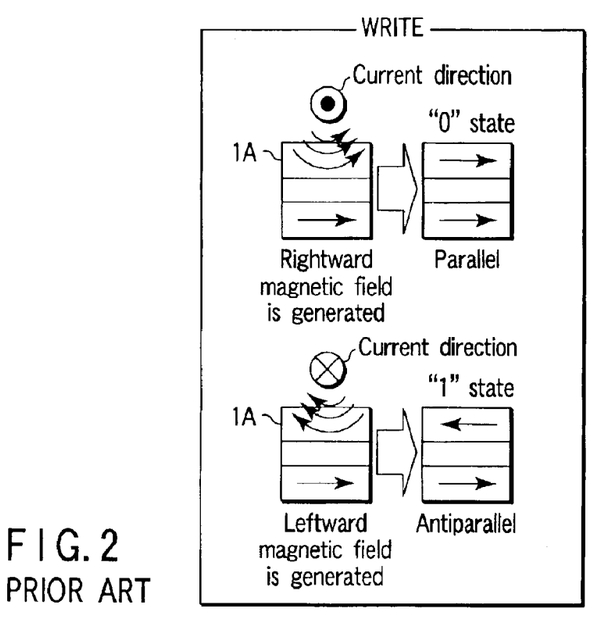
FIG. 2 is a view showing the write principle.
Figure 3:
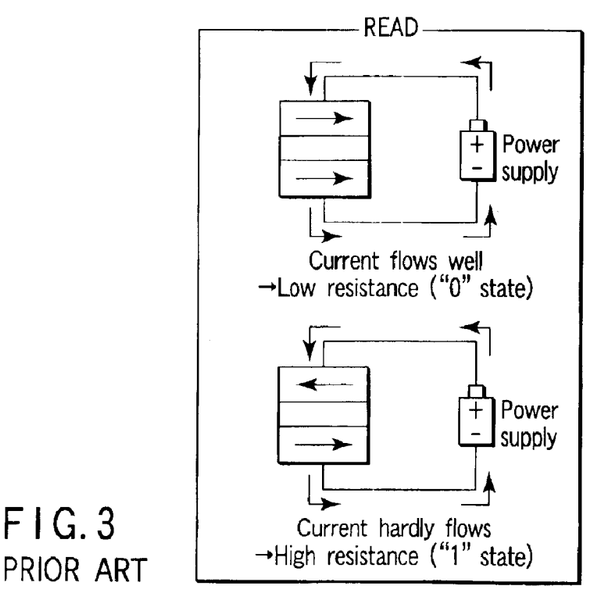
FIG. 3 is a view showing the read principle.

Data is written by causing a rightward or leftward magnetic field to act on the magnetic layer 1A, as shown in FIG. 2. Data is read out by detecting the resistance value of the MTJ element, as shown in FIG. 3. When the magnetization directions of the MTJ element are parallel, the tunnel resistance of the tunnel barrier of the MTJ element becomes lowest. This state is defined as, e.g., a "0" state. When the magnetization directions of the MTJ element are antiparallel, the tunnel resistance of the tunnel barrier of the MTJ element becomes highest. This state is defined as, e.g., a "1" state.

The most important subject of the magnetic random access memory is to reduce the write current. In the memory using the MTJ element, the write current value is higher than an ideal value (8 to 10 mA), and the write current value greatly varies between bit lines, generating a write error.

To put magnetic random access memories into practical use, the write current value and its variations must be reduced to an allowable level. The current write current value reported in academic societies and the like is about 8 mA for an MTJ element about 0.6 $\mu$m wide and about 1.2 $\mu$m long.

A magnetic field generated by the write current must be strong enough to reverse the magnetization direction of the recording layer (e.g., NiFe with a thickness of 2 to 5 nm) of the MTJ element. This means that a weaker magnetic field necessary to reverse the magnetization direction of the recording layer of the MTJ element can decrease the write current value.

A magnetic field H necessary to reverse the magnetization direction of the recording layer of the MTJ element is given by $$H = 4\pi M_S \times t/F [OE] \quad (1)$$

Ms: saturation magnetization, t: recording layer thickness, F: recording layer width From relation (1), decreasing the recording layer thickness t can weaken the magnetic field H necessary to reverse the magnetization direction of the recording layer of the MTJ element.

However, ensuring thermal disturbance resistance limits a decrease in the thickness of the recording layer of the MTJ element. Considering processing of the MTJ element, the recording layer thickness t must be increased for a recording layer width F of 0.15 $\mu$m or less.

Relation (1) also reveals that the magnetic field H necessary to reverse the magnetization direction of the recording layer of the MTJ element is inversely proportional to the recording layer width F. In the future, the recording layer width F is projected to become smaller along with micropatterning of the MTJ element. This increases the write current value much more.

The current density of a current which can be supplied to wiring has an upper limit. This upper limit is $1 \times 10^7$ [A/cm$^2$] for Cu wiring. Since the sectional area of wiring decreases along with micropatterning of the MTJ element, the upper limit becomes lower. As a result, the magnetic field H necessary to reverse the magnetization direction of the recording layer cannot be generated.

A newly developed technique in this situation is a yoke-attached wiring technique.

In the yoke-attached wiring technique, a wiring line (e.g., Cu) as a write line is covered with a soft magnetic material (yoke material) such as NiFe in at least a region where an MTJ element exists. This technique can efficiently concentrate the magnetic field on the MTJ element, reducing the write current value.

At present, it has been reported in academic societies and the like that a memory to which the yoke-attached wiring technique is applied exhibits a write efficiency double that of a memory to which this technique is not applied.

Figure 4:
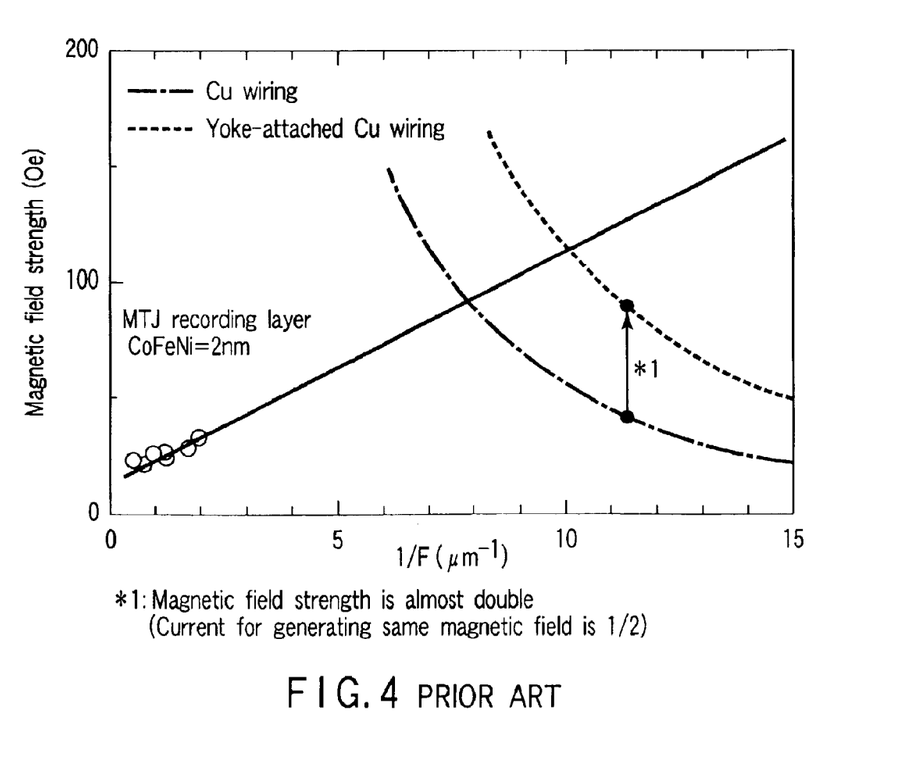
FIG. 4 is a graph showing the effect of increasing the write efficiency by a yoke-attached wiring technique.

As is apparent from the experimental results shown in FIG. 4, compared to the write current in a memory to which the yoke-attached wiring technique is not applied, a write current half that value is large enough to reverse the magnetization direction of the recording layer of the MTJ element in the memory to which the technique is applied.

A magnetic random access memory to which the yoke-attached wiring technique is applied can reduce the write current value. However, the write current value and its variations are still large for practical use of the magnetic random access memory.

For example, a write line covered with a yoke material was examined by experiments and computer simulation. The write efficiency almost doubled, but disturbs (write errors in half-selected cells) increased.

To solve this problem and reduce the write current, the following three points must be examined.

① Write Selector Transistor

For example, write lines are individually arranged for MTJ elements, and the current is supplied to only the write line of a selected MTJ element. This technique can effectively decrease disturbs.

② Covering of Entire Surface of Write Line

The entire surface (upper, lower, and side surfaces) of a write line is covered with a yoke material. By covering the write line with the yoke material, the write efficiency can be further increased.

③ Exchange Coupling

The recording layer (magnetic material) of an MTJ element is brought into contact with a yoke material (magnetic material), and exchange-coupled to the yoke material. "The recording layer is exchange-coupled to the yoke material" means that they have a relationship in which the exchange interaction of electron energy acts. Exchange coupling between the MTJ element and the recording layer can contribute to an increase in write efficiency.

Figure 5:
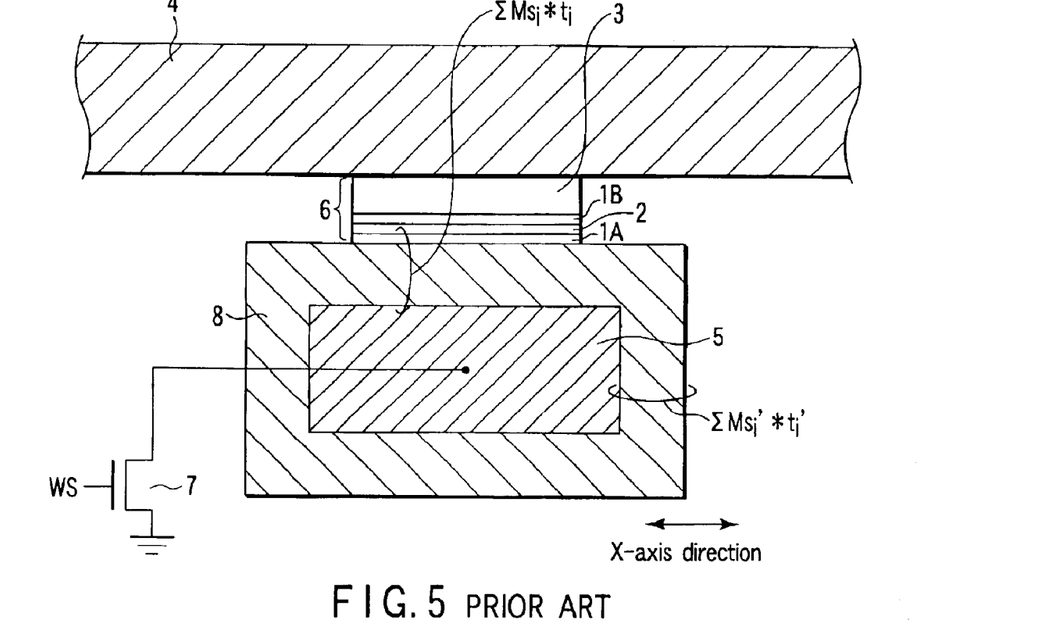
FIG. 5 is a sectional view showing another conventional magnetic random access memory.

FIG. 5 shows an example of the MTJ element of a magnetic random access memory to which all the techniques ①, ②, and ③ are applied and a device structure near the MTJ element.

An MTJ element 6 is arranged at the intersection of two write lines 4 and 5 crossing each other. The write line 5 is connected to a write selector transistor 7. The entire surface of the write line 5 is covered with a yoke material (e.g., NiFe) 8. The MTJ element 6 is directly arranged on the yoke material 8 on the upper surface of the write line 5. The magnetic layer 1A of the MTJ element 6 is exchange-coupled to the yoke material 8.

In this case, Ms*t is defined as a magnetic volume for magnetic layer saturation magnetization Ms and a magnetic layer thickness t.

The magnetic volume around the write line 5 will be examined. On the side and lower surfaces of the write line 5, the magnetic volume is $$\Sigma Ms_i' \times t_i' = Ms' \times t'.$$

where Ms' is the yoke material saturation magnetization, and t' is the yoke material thickness.

On the upper surface of the write line 5, the magnetic volume is $$\Sigma Ms_i \times t_i = Ms \times t + Ms' \times t'.$$

where Ms is the recording layer saturation magnetization of the MTJ element, and t is the recording layer thickness of the MTJ element.

Hence, the magnetic random access memory in FIG. 5 satisfies the inequality:

$$\Sigma Ms_i' \times t_i' < \Sigma Ms_i \times t_i.$$

In the device structure shown in FIG. 5, disturbs can be satisfactorily decreased. However, the write current value can be reduced to only about 1 mA. For the 1-mA write current, the size (channel width) of the write selector transistor through which this write current flows must be about 1 µm. Such write selector transistors are arranged for respective MTJ elements.

If a magnetic random access memory having a memory capacity of 256 Mega bits or more is constructed, the chip size becomes very large. The magnetic random access memory cannot be put into practical use.

The most serious problem is low write reproducibility. More specifically, write may be achieved with a write current of 1 mA. However, repetitive overwrite results in an overwrite failure at a probability of several ten % (write pass rate=about 87%).

This is because the magnetization of the yoke material (magnetic material) which covers the write line remains in the circumferential direction of the write line upon repetitive write, greatly decreasing the magnetic permeability of the yoke material.

BRIEF SUMMARY OF THE INVENTION

A magnetic random access memory according one aspect of the present invention comprises a memory cell having a first magnetic layer to record data, a write line including a function which applies a magnetic field to the first magnetic layer, and a second magnetic layer which covers all or part of the write line, wherein the first magnetic layer is exchange-coupled to the second magnetic layer, and a sum of a first magnetic volume Ms1×t1 of the first magnetic layer and a second magnetic volume Ms2×t2 of a first portion of the second magnetic layer that is exchange-coupled to the first magnetic layer is smaller than a third magnetic volume Ms'×t' of a second portion of the second magnetic layer except the first portion, where Ms1 is saturation magnetization of the first magnetic layer, t1 is a thickness of the first magnetic layer, Ms2 is saturation magnetization of the first portion of the second magnetic layer, t2 is a thickness of the first portion of the second magnetic layer, Ms' is saturation magnetization of the second portion of the second magnetic layer, and t' is a thickness of the second portion of the second magnetic layer.

A magnetic random access memory according another aspect of the present invention comprises a memory cell having a first magnetic layer to record data, a write line including a function which applies a magnetic field to the first magnetic layer, and a second magnetic layer which covers all or part of the write line, wherein the first magnetic layer is exchange-coupled to the second magnetic layer, and a thickness of a first portion of the second magnetic layer that is exchange-coupled to the first magnetic layer is set smaller than a thickness of a main part of a second portion of the second magnetic layer except the first portion.

A magnetic random access memory according still another aspect of the present invention comprises a memory cell having a first magnetic layer to record data, a write line including a function which applies a magnetic field to the first magnetic layer, and a second magnetic layer which covers all or part of the write line, wherein the second magnetic layer has a recess from which an upper surface of the write line is exposed, the memory cell is arranged in the recess, and the first magnetic layer is exchange-coupled to the second magnetic layer on a side surface.

DETAILED DESCRIPTION OF THE INVENTION

A magnetic random access memory according to preferred embodiments of the present invention will be described in detail below with reference to several views of the accompanying drawing.

1. General Description

Preferred embodiments of the present invention are applied to a magnetic random access memory having a write line covered with a yoke material (magnetic material). The yoke material increases an induced magnetic field applied to an MTJ element. The use of the yoke-attached wiring technique can basically reverse the magnetization direction of the MTJ element at high efficiency with a small write current.

The embodiments of the present invention assume an exchange coupling technique developed from the yoke-attached wiring technique in order to further increase the write efficiency. According to the exchange coupling technique, for example, an MTJ element is brought into contact with a yoke material. The exchange interaction of electron energy is caused to act between the recording layer of the MTJ element and the yoke material.

In the embodiments of the present invention, a concept "magnetic volume" is defined. The magnetic volume is a parameter represented by "Ms*t" for magnetic layer saturation magnetization "Ms" and a magnetic layer thickness "t".

For example, on the side and lower surfaces of the write line 5 in the magnetic random access memory of FIG. 5, the magnetic volume is $$\Sigma Msi' \times ti' = Ms' \times t'.$$

where Ms' is the yoke material saturation magnetization, and t' is the yoke material thickness.

On the upper surface of the write line 5, the magnetic volume is $$\Sigma Msi \times ti = Ms \times t + Ms' \times t'.$$

where Ms is the recording layer saturation magnetization of the MTJ element, and t is the recording layer thickness of the MTJ element.

The magnetic random access memory in FIG. 5 therefore satisfies the inequality $$\Sigma Msi' \times ti' < \Sigma Msi \times ti.$$

To the contrary, in the embodiments of the present invention, the total magnetic volume $\Sigma Msi \times ti$ of the recording layer (magnetic material) of the MTJ element and a portion of the yoke material (magnetic material) that is exchange-coupled to the recording layer is set smaller than the magnetic volume $\Sigma Msi' \times ti'$ of the remaining portion of the yoke material which covers the write line.

$$\Sigma Msi' \times ti' > \Sigma Msi \times ti$$

When the recording layer of the MTJ element is formed from n (n is 2 or more) layers, $\Sigma Msi \times ti$ (i=1, 2, 3, ..., n) includes the sum of the magnetic volumes of the n layers:

$$\Sigma Msi \times ti = Ms1 \times t1 + Ms2 \times t2 + Ms3 \times t3 + ... + Msn \times tn.$$

When a portion of the yoke material that is exchange-coupled to the recording layer of the MTJ element is formed from m (m is 2 or more) layers, $\Sigma Msi \times ti$ (i=1, 2, 3, ..., m) includes the sum of the magnetic volumes of the m layers:

$$\Sigma Msi \times ti = Ms1 \times t1 + Ms2 \times t2 + Ms3 \times t3 + ... + Msm \times tm.$$

Similarly, when the yoke material except a portion exchange-coupled to the recording layer of the MTJ element is formed from k (k is 2 or more) layers, $\Sigma Msi' \times ti'$ (i=1, 2, 3, ..., k) includes the sum of the magnetic volumes of the k layers:

$$\Sigma Msi' \times ti' = Ms1' \times t1' + Ms2' \times t2' + Ms3' \times t3' + ... + Msk' \times tk'.$$

As long as the above-mentioned relation is satisfied, the layered structure of a portion of the yoke material that is in contact with the recording layer of the MTJ element and the layered structure of the remaining portion of the yoke material that covers the write line may be the same or different from each other. Also, the material which forms a portion of the yoke material that is in contact with the recording layer of the MTJ element and the material which forms the remaining portion of the yoke material that covers the write line may be the same or different from each other.

Assume that a portion of the yoke material that is in contact with the recording layer of the MTJ element and the remaining portion of the yoke material that covers the write line have the same layered structure and are made of the same material. In this case, the above-mentioned relation can be satisfied by setting the thickness of a portion of the yoke material that is in contact with the recording layer of the MTJ element smaller than the thickness of the remaining portion of the yoke material that covers the write line.

This device structure can reduce the write current value to 1 mA or less. As a magnetic volume ratio Rm (=$\Sigma Msi \times ti / \Sigma Msi' \times ti'$) decreases, the write current value decreases, and write errors can be reduced.

Further, a high write pass rate (decrease in write errors) can be realized by setting the magnetization direction of the yoke material in a direction in which the write line covered with the yoke material runs, details of which will be described later. Experimental results indicated that a remarkable effect could be obtained when the magnetic volume ratio Rm was set to 0.9 or less, or 0.3 or less, as will be described in detail later.

This embodiment of the invention is applied to a write line. Nonetheless, the write line may function as a write line only or may function not only as a write line, but also as, for example, a read line. In the following embodiments that are so-called "cross-point cell arrays", each write line works as a read line, as well. The present invention is not limited to cross-point cell arrays. Rather, it can be applied to a cell array, such as a 1transistor-1MTJ structure in which one of two write lines is spaced apart from an MTJ element.

2. First Embodiment

Figure 6:
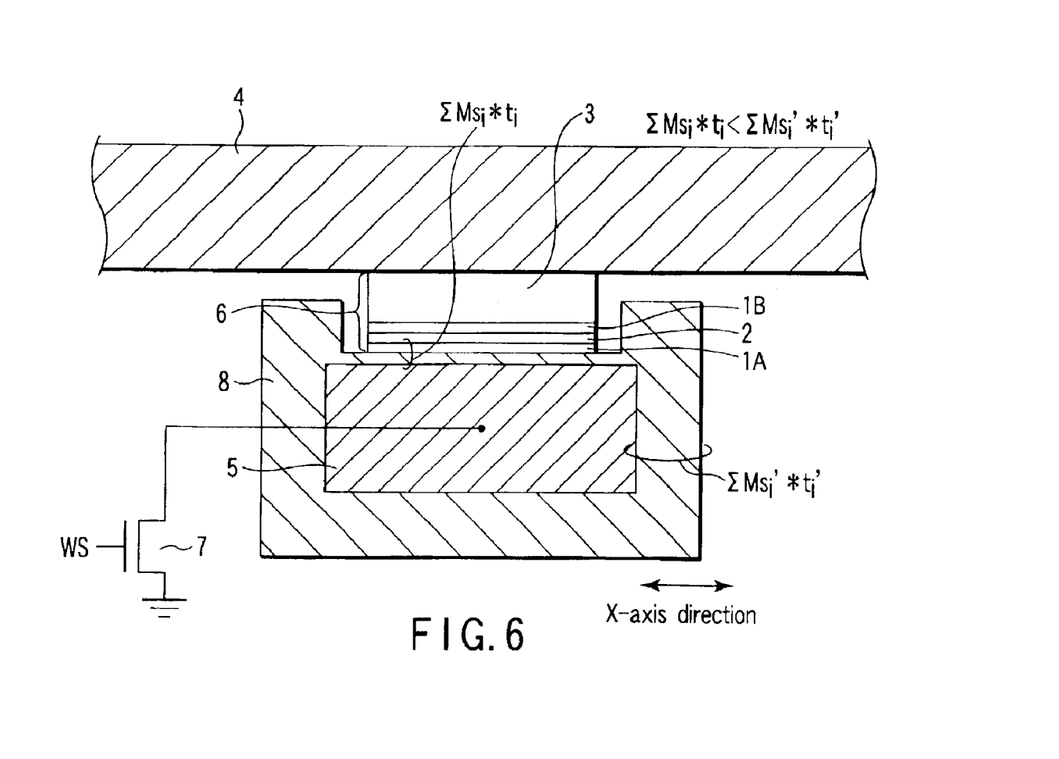
FIG. 6 is a sectional view showing a magnetic random access memory according to the first embodiment of the present invention.
Figure 7:
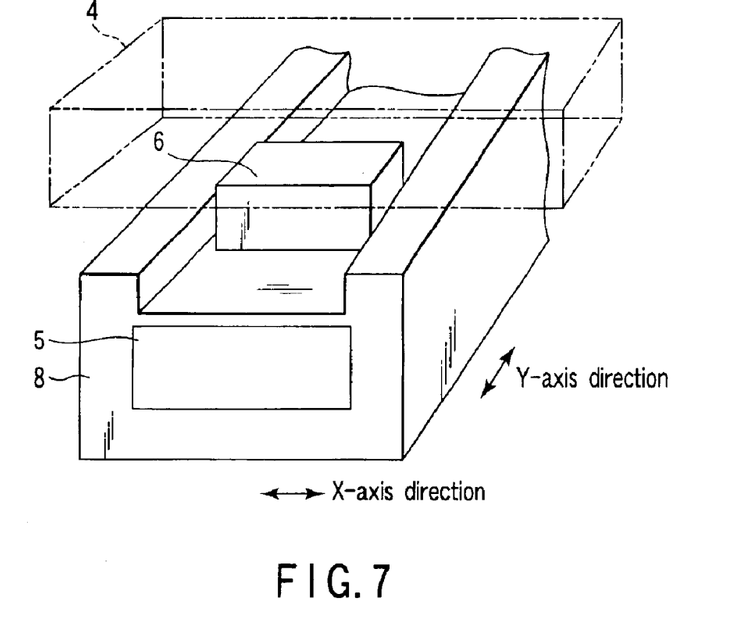
FIG. 7 is a perspective view showing the magnetic random access memory according to the first embodiment of the present invention.

FIG. 6 shows the device structure of the main part of a magnetic random access memory according to the first embodiment of the present invention. FIG. 7 is a perspective view three-dimensionally showing the structure of FIG. 6.

A write line 4 runs along the X-axis, and a write line 5 runs along the Y-axis. The write lines 4 and 5 are made of, e.g., Cu. An MTJ element 6 is arranged at the intersection of the two write lines 4 and 5 crossing each other. The MTJ element 6 has a rectangular shape which is long along the X-axis and short along the Y-axis. In this case, the easy axis of magnetization of the MTJ element 6 is the X-axis.

The MTJ element 6 is made up of, e.g., a recording layer (magnetic layer) 1A, fixed layer (magnetic layer) 1B, tunneling barrier layer 2, and antiferromagnetic layer 3. The antiferromagnetic layer 3 of the MTJ element 6 is arranged on the write line 4 side. The antiferromagnetic layer 3 is made of, e.g., PtMn or CoFe. The recording layer 1A of the MTJ element 6 is arranged on the write line 5 side. The recording layer 1A is made of, e.g., NiFe.

The fixed layer 1B of the MTJ element 6 is in contact with the antiferromagnetic layer 3, and its magnetization direction is fixed. The fixed layer 1B is made of, e.g., NiFe. The tunneling barrier layer 2 is interposed between the recording layer 1A and the fixed layer 1B. The tunneling barrier layer 2 is made of, e.g., $Al_2O_3$.

The write line 5 is covered with a yoke material (magnetic material) 8. The yoke material 8 is, e.g., NiFe. The magnetic permeability of the yoke material 8 is higher than that of the recording layer 1A. The yoke material 8 is higher in saturation flux density than the recording layer 1A.

At a portion except the portion where the MTJ element 6 exists, the yoke material 8 surrounds the write line 5 with almost the same thickness t'. Letting Ms' be the saturation magnetization of a portion of the yoke material 8 except the portion where the MTJ element 6 exists, the magnetic volume of the portion of the magnetic layer (yoke material) except the portion where the MTJ element 6 exists is given by $$\Sigma MSi' \times ti' = Ms' \times t'.$$

The recording layer 1A of the MTJ element 6 is exchange-coupled to the yoke material 8 which covers the write line 5. For example, the recording layer 1A of the MTJ element 6 is in contact with the yoke material 8, and the exchange interaction of electron energy acts between the recording layer 1A of the MTJ element 6 and the yoke material 8.

A thickness t2 of the yoke material 8 at the portion where the MTJ element 6 exists is smaller than a thickness (average value) t' at the remaining portion except the portion where the MTJ element 6 exists. Letting t1 be the thickness of the recording layer 1A of the MTJ element 6, Ms1 (=Ms) be the saturation magnetization of the recording layer 1A, and Ms2 (=Ms') be the saturation magnetization of the yoke material 8 at the portion where the MTJ element 6 exists, the sum of the magnetic volume of the magnetic layer (recording layer+yoke material) at the portion where the MTJ element 6 exists is given by $$\Sigma Msi \times ti = Ms1 \times t1 + Ms2 \times t2 = Ms \times t1 + Ms' \times t2.$$

As described above, in the first embodiment of the present invention, the total magnetic volume $\Sigma Msi \times ti$ of the recording layer 1A of the MTJ element 6 and a portion of the yoke material 8 that is exchange-coupled to the recording layer 1A is set smaller than the magnetic volume $\Sigma Msi' \times ti'$ of the remaining portion of the yoke material 8 that covers the write line 5:

$$\Sigma Msi \times ti < \Sigma Msi' \times ti'$$

3. Second Embodiment

Figure 8:
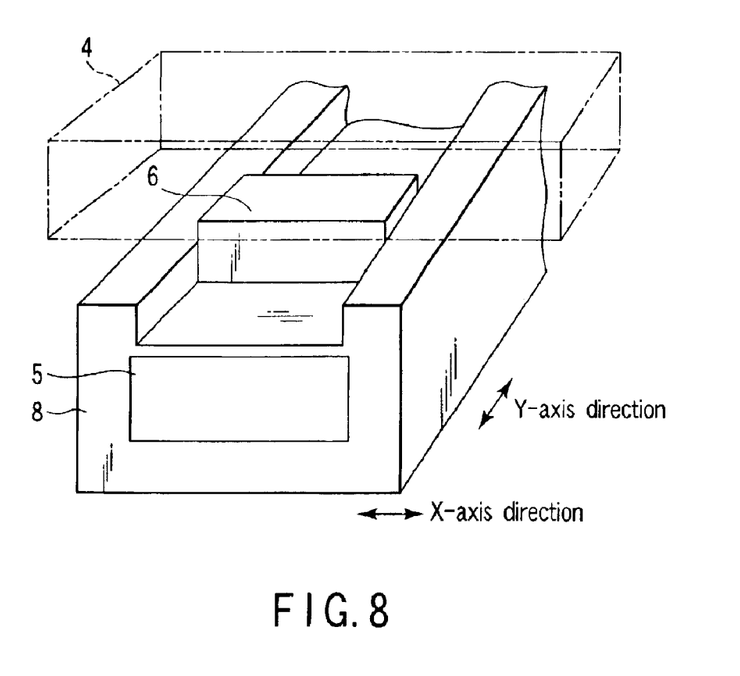
FIG. 8 is a perspective view showing a magnetic random access memory according to the second embodiment of the present invention.

FIG. 8 shows the device structure of the main part of a magnetic random access memory according to the second embodiment of the present invention.

The device structure of the second embodiment is different from that of the first embodiment in that the X-axis (easy axis of magnetization) end of an MTJ element 6 is in contact with a yoke material 8. In this case, the recording layer of the MTJ element 6 is exchange-coupled to the yoke material 8 on the lower and side surfaces. The remaining structure is the same as that of the first embodiment.

Also in the second embodiment, the total magnetic volume $\Sigma Msi \times ti$ of the recording layer of the MTJ element 6 and a portion of the yoke material 8 that is exchange-coupled to the recording layer is set smaller than the magnetic volume $\Sigma Msi' \times ti'$ of the remaining portion of the yoke material 8 that covers a write line 5.

4. Third Embodiment

Figure 9:
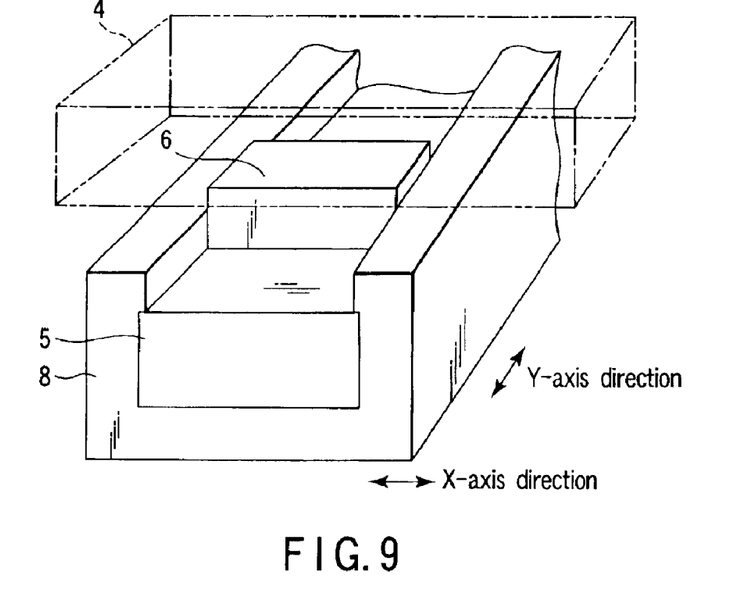
FIG. 9 is a perspective view showing a magnetic random access memory according to the third embodiment of the present invention.

FIG. 9 shows the device structure of the main part of a magnetic random access memory according to the third embodiment of the present invention.

The device structure of the third embodiment is different from that of the second embodiment in that no yoke material exists immediately below an MTJ element 6, i.e., the lower surface of the MTJ element 6 is in contact with the upper surface of a write line 5 without the mediacy of any yoke material.

The MTJ element 6 is in contact with a yoke material 8 on only the X-axis (easy axis of magnetization) end. In this case, the recording layer of the MTJ element 6 is exchange-coupled to the yoke material 8 on the side surface. The remaining structure is the same as that of the second embodiment.

Also in the third embodiment, the total magnetic volume $\Sigma Msi \times ti$ of the recording layer of the MTJ element 6 and a portion of the yoke material 8 that is exchange-coupled to the recording layer is set smaller than the magnetic volume $\Sigma Msi'\times ti'$ of the remaining portion of the yoke material 8 that covers the write line 5.

5. Fourth Embodiment

Figure 10:
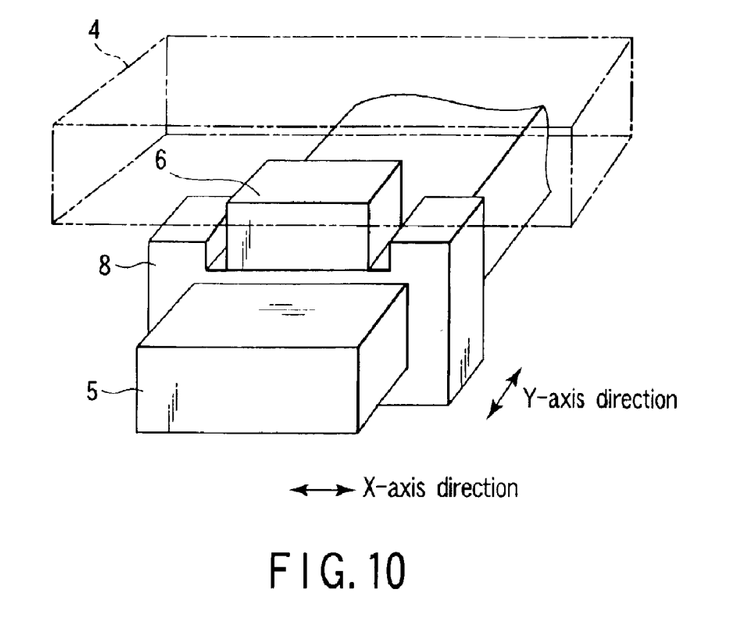
FIG. 10 is a perspective view showing a magnetic random access memory according to the fourth embodiment of the present invention.

FIG. 10 shows the device structure of the main part of a magnetic random access memory according to the fourth embodiment of the present invention.

The device structure of the fourth embodiment is different from that of the first embodiment in that a yoke material 8 covers only part of a write line 5. In the fourth embodiment, the yoke material 8 is arranged at only the intersection of two write lines 4 and 5, i.e., the portion where an MTJ element 6 exists. The remaining structure is the same as that of the first embodiment.

Also in the fourth embodiment, the recording layer of the MTJ element 6 and the yoke material 8 are exchange-coupled to each other. The total magnetic volume $\Sigma Msi\times ti$ of the recording layer of the MTJ element 6 and a portion of the yoke material 8 that is exchange-coupled to the recording layer is set smaller than the magnetic volume $\Sigma Msi'\times ti'$ of the remaining portion of the yoke material 8 that covers the write line 5.

6. Fifth Embodiment

Figure 11:
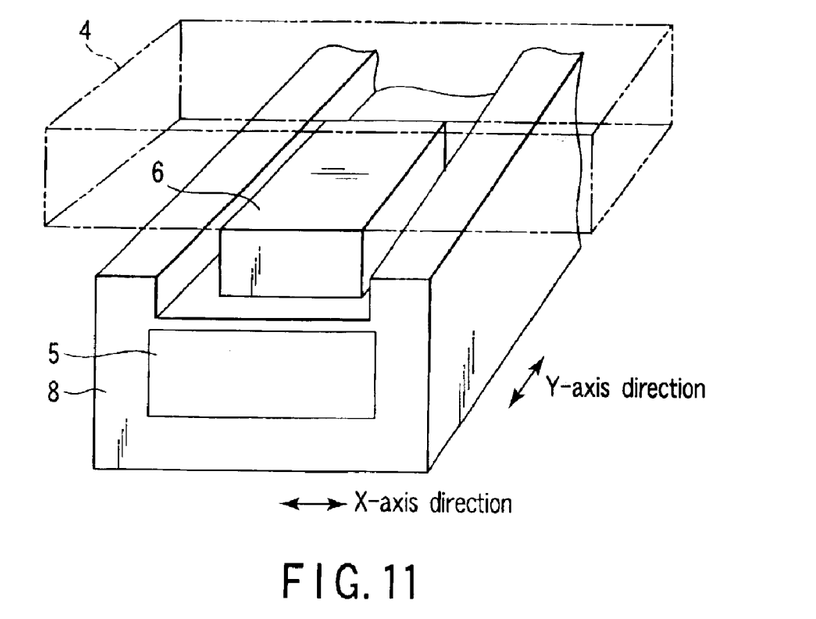
FIG. 11 is a perspective view showing a magnetic random access memory according to the fifth embodiment of the present invention.

FIG. 11 shows the device structure of the main part of a magnetic random access memory according to the fifth embodiment of the present invention.

The device structure of the fifth embodiment is different from that of the first embodiment in that the easy axis of magnetization of an MTJ element 6 is the Y-axis. That is, the MTJ element 6 has a rectangular shape which is short along the X-axis and long along the Y-axis. The remaining structure is the same as that of the first embodiment.

Also in the fifth embodiment, the recording layer of the MTJ element 6 and a yoke material 8 are exchange-coupled to each other. The total magnetic volume $\Sigma Msi\times ti$ of the recording layer of the MTJ element 6 and a portion of the yoke material 8 that is exchange-coupled to the recording layer is set smaller than the magnetic volume $\Sigma Msi'\times ti'$ of the remaining portion of the yoke material 8 that covers a write line 5.

7. Sixth Embodiment

Figure 12:
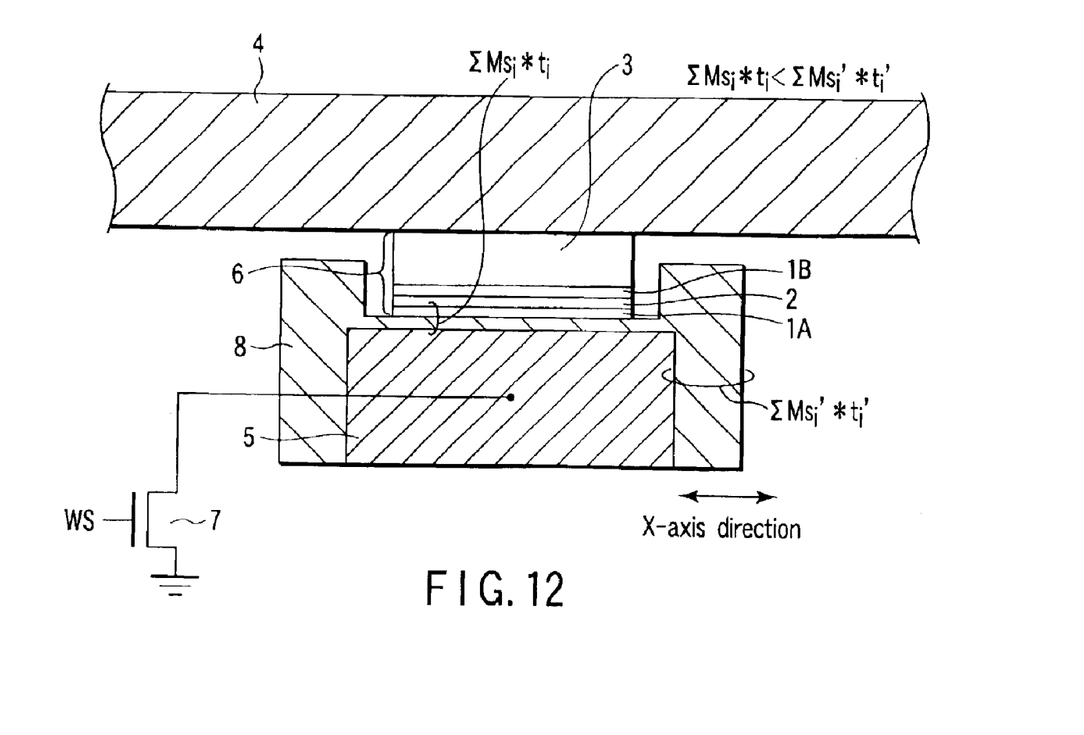
FIG. 12 is a sectional view showing a magnetic random access memory according to the sixth embodiment of the present invention.

FIG. 12 shows the device structure of the main part of a magnetic random access memory according to the sixth embodiment of the present invention.

The device structure of the sixth embodiment is different from that of the first embodiment in that the lower surface of a write line 5 is not covered with a yoke material 8. The remaining structure is the same as that of the first embodiment. The sixth embodiment can realize cost reduction because of a smaller number of manufacturing steps than in a case wherein the entire surface of the write line 5 is covered with the yoke material 8.

Also in the sixth embodiment, the recording layer of an MTJ element 6 and the yoke material 8 are exchange-coupled to each other. The total magnetic volume $\Sigma Msi\times ti$ of the recording layer of the MTJ element 6 and a portion of the yoke material 8 that is exchange-coupled to the recording layer is set smaller than the magnetic volume $\Sigma Msi'\times ti'$ of the remaining portion of the yoke material 8 that covers the write line 5.

In the sixth embodiment, ti' represents the thickness (average value) of the yoke material 8 at the portion where the yoke material 8 exists except the portion where the MTJ element 6 exists.

8. Seventh Embodiment

Figure 13:
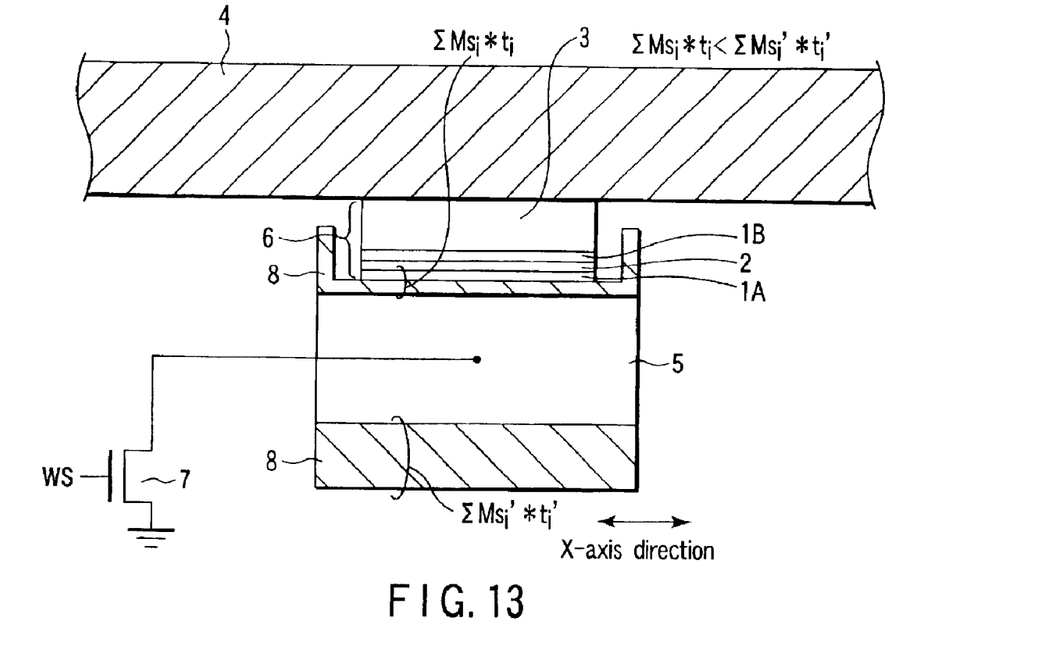
FIG. 13 is a sectional view showing a magnetic random access memory according to the seventh embodiment of the present invention.

FIG. 13 shows the device structure of the main part of a magnetic random access memory according to the seventh embodiment of the present invention.

The device structure of the seventh embodiment is different from that of the first embodiment in that the side surface of a write line 5 is not covered with a yoke material 8. The remaining structure is the same as that of the first embodiment. The seventh embodiment can also achieve cost reduction because of a smaller number of manufacturing steps than in a case wherein the entire surface of the write line 5 is covered with the yoke material 8.

Also in the seventh embodiment, the recording layer of an MTJ element 6 and the yoke material 8 are exchange-coupled to each other. The total magnetic volume $\Sigma Msi\times ti$ of the recording layer of the MTJ element 6 and a portion of the yoke material 8 that is exchange-coupled to the recording layer is set smaller than the magnetic volume $\Sigma Msi'\times ti'$ of the remaining portion of the yoke material 8 that covers the write line 5.

Also in the seventh embodiment, ti' represents the thickness (average value) of the yoke material 8 at the portion where the yoke material 8 exists except the portion where the MTJ element 6 exists.

9. Eighth Embodiment

Figure 14:
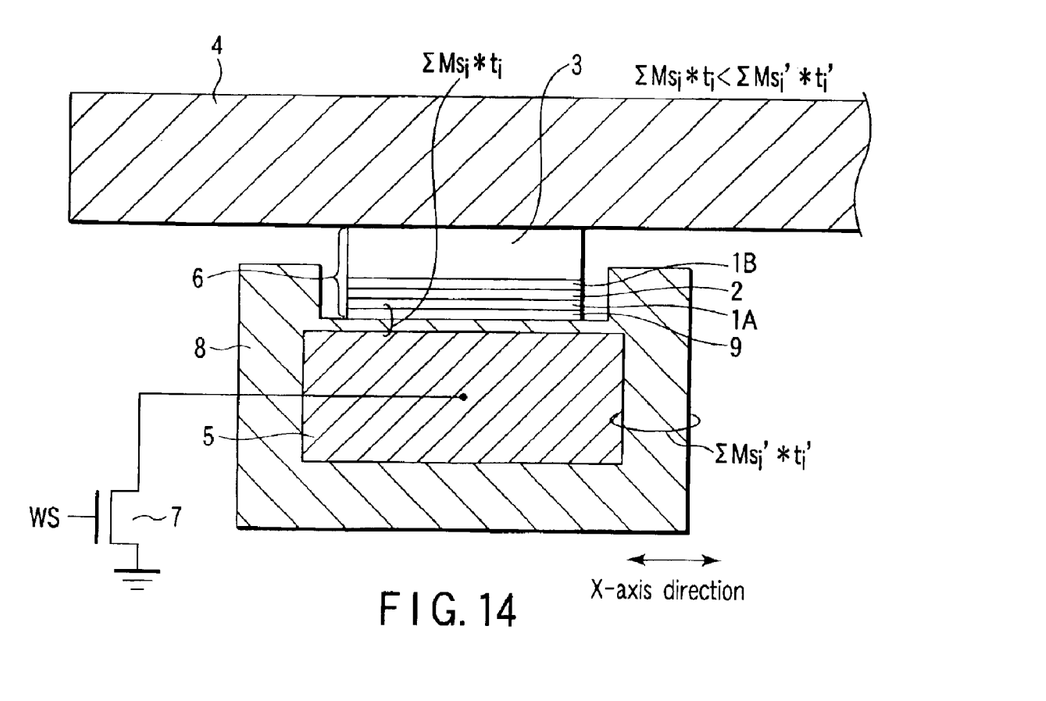
FIG. 14 is a sectional view showing a magnetic random access memory according to the eighth embodiment of the present invention.

FIG. 14 shows the device structure of the main part of a magnetic random access memory according to the eighth embodiment of the present invention.

The device structure of the eighth embodiment is different from that of the first embodiment in that a nonmagnetic layer 9 is interposed between a recording layer 1A of an MTJ element and a yoke material 8. The nonmagnetic layer 9 is made of, e.g., Ru. The remaining structure is the same as that of the first embodiment.

In this case, the recording layer 1A of an MTJ element 6 is exchange-coupled to the yoke material 8 via the nonmagnetic layer 9. The total magnetic volume $\Sigma Msi\times ti$ of the recording layer 1A of the MTJ element 6 and a portion of the yoke material 8 that is exchange-coupled to the recording layer 1A is set smaller than the magnetic volume $\Sigma Msi'\times ti'$ of the remaining portion of the yoke material 8 that covers a write line 5.

10. Magnetization Direction of Yoke Material and Write Current Direction

Figure 15:
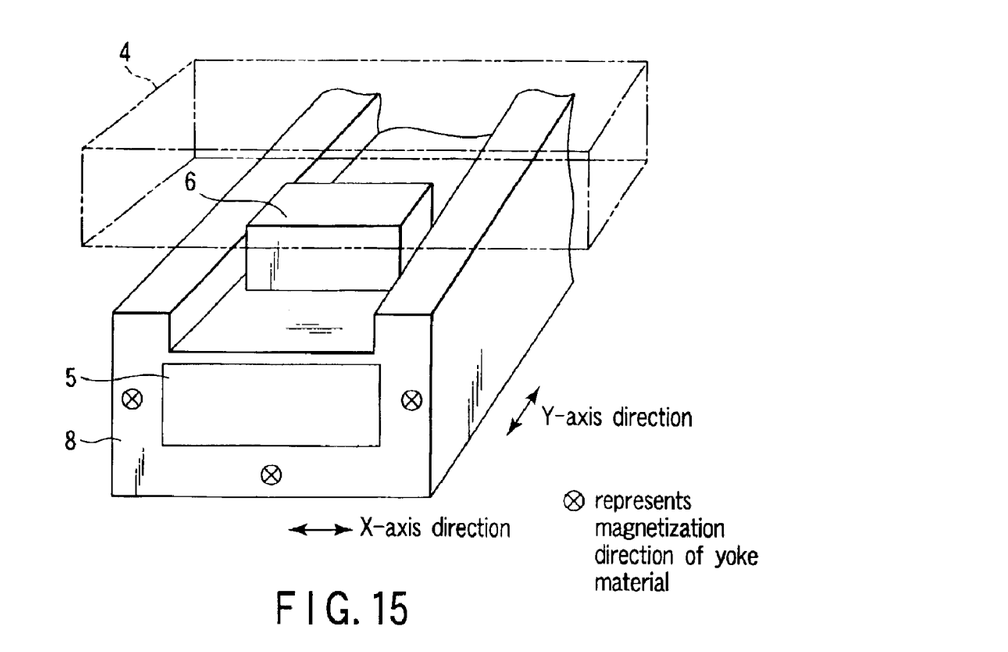
FIG. 15 is a perspective view showing an example of the magnetization direction of a yoke material which covers a write line.
Figure 16:
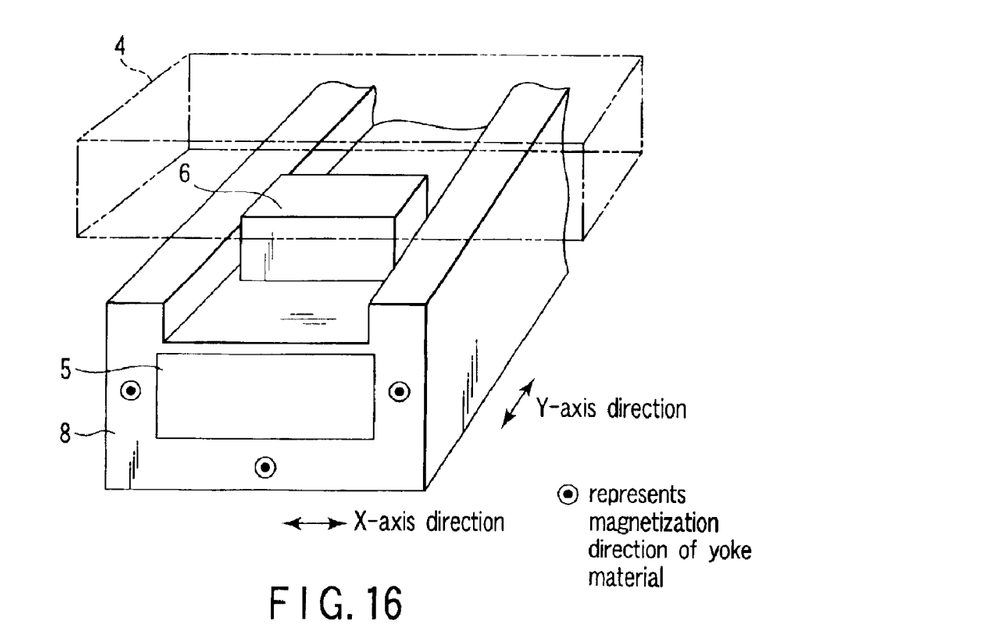
FIG. 16 is a perspective view showing another example of the magnetization direction of the yoke material which covers the write line.

FIGS. 15 and 16 show examples of the magnetization direction of the yoke material in the present invention.

In the embodiments of the present invention, it is desirable that the magnetization of the yoke material 8 is always oriented to a direction in which the write line 5 runs, i.e., the Y-axis direction. This structure can solve the conventional problem that the magnetization of the yoke material 8 remains in the circumferential direction of the write line 5 upon repetitive write to decrease the magnetic permeability of the yoke material 8.

In the example of FIG. 15, the magnetization of the yoke material 8 is oriented to the Y-axis (upward direction on the sheet surface of FIG. 15) or a direction close to the Y-axis. In the example of FIG. 16, the magnetization of the yoke material 8 is oriented to the Y-axis (direction down from the sheet surface of FIG. 16) or a direction close to the Y-axis.

The easy axis of magnetization of the MTJ element 6 is, e.g., the X-axis. In this case, the magnetization of the recording layer 1A of the MTJ element 6 is oriented to the X-axis, i.e., the direction of width of the write line 5 (rightward or leftward in accordance with the data value).

Figure 17:
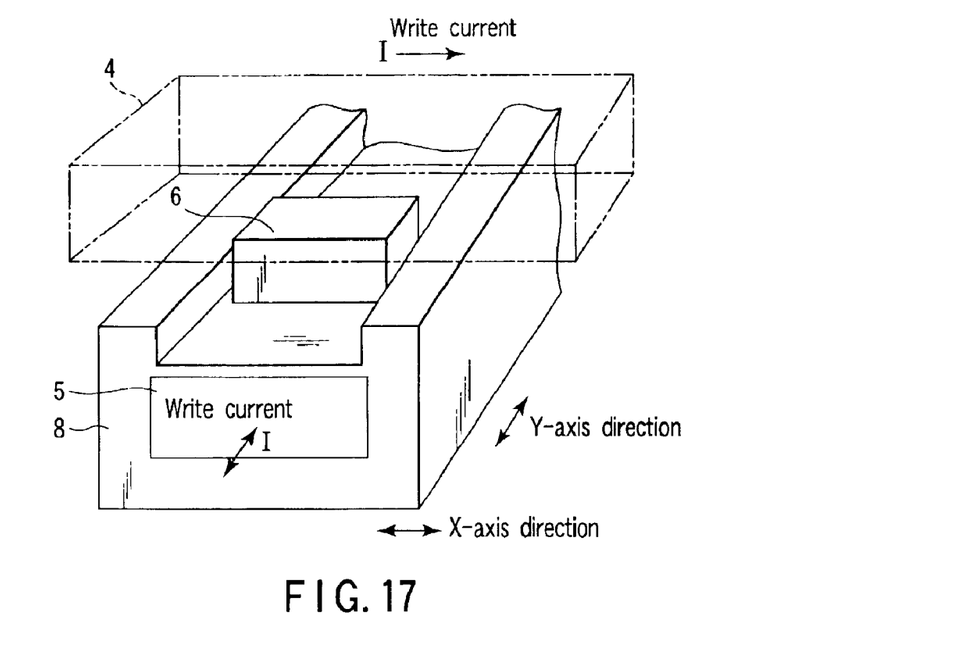
FIG. 17 is a perspective view showing an example of the direction of a write current flowing through the write line.
Figure 18:
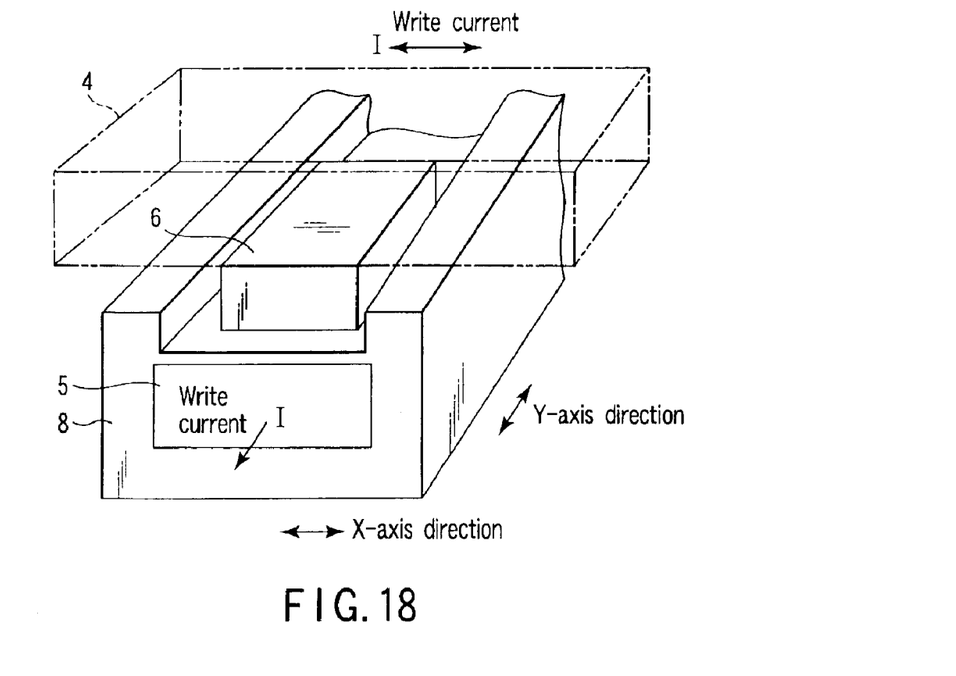
FIG. 18 is a perspective view showing another example of the direction of the write current flowing through the write line.

FIGS. 17 and 18 show examples of the directions of write currents flowing through the write lines 4 and 5 in the present invention.

In general, a write current always in one direction is supplied to one of the write lines 4 and 5. A write current whose direction changes depending on the write data value is supplied to the other write line.

In the example of FIG. 17, a write current always in one direction is supplied to the write line 4. A write current whose direction changes depending on the write data value is supplied to the write line 5 covered with the yoke material 8. In this case, the easy axis of magnetization of the MTJ element 6 must be the X-axis.

In the example of FIG. 18, a write current whose direction changes depending on the write data value is supplied to the write line 4. A write current always in one direction is supplied to the write line 5 covered with the yoke material 8. In this case, the easy axis of magnetization of the MTJ element 6 must be the Y-axis.

11. Experimental Results (Effects)

The effects of the present invention will be explained in detail below.

As for the MTJ element, the cell width is set to about 0.4 $\mu$m, and the cell length is set to about 1.2 $\mu$m. The interval between the MTJ element and the write line (digit line) immediately below it is set to about 150 nm. The recording layer of the MTJ element is formed from a NiFe film about 5 nm thick.

In this case, in a magnetic random access memory to which no yoke-attached wiring technique is applied, the average value of the write current necessary for write is about 10 mA. In a magnetic random access memory to which the yoke-attached wiring technique is applied, the average value of the write current necessary for write is about 5 mA.

In a magnetic random access memory having the device structure shown in FIG. 5, the average value of the write current necessary for write can be decreased to about 1 mA.

In the embodiments of the present invention, the total magnetic volume $\Sigma Ms_i \times t_i$ of the recording layer of the MTJ element and a portion of the yoke material that is exchange-coupled to the recording layer is set smaller than the magnetic volume $\Sigma Ms_i' \times t_i'$ of the remaining portion of the yoke material that covers the write line. This setting can decrease the average value of the write current necessary for write to about 1 mA.

Figure 19:
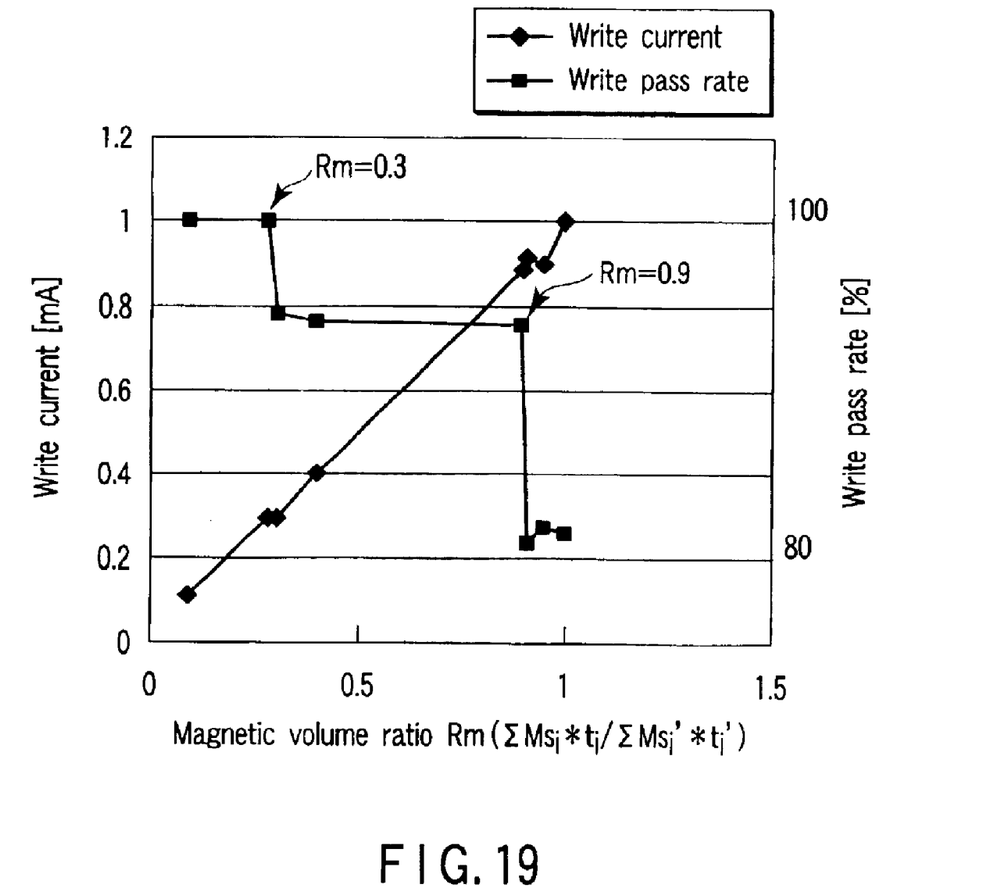
FIG. 19 is a graph showing the relationship between the magnetic volume ratio, the write current, and the write pass rate.

FIG. 19 shows the experimental results (effects) according to the embodiments of the present invention.

The effects according to the embodiments of the present invention will be explained based on the parameter: magnetic volume ratio ($\Sigma Ms_i \times t_i / \Sigma Ms_i' \times t_i'$).

According to the embodiments of the present invention, the magnetic volume ratio is always 1 or less. As the magnetic volume ratio decreases, the average value of the write current decreases, increasing the write efficiency.

The experimental results reveal that the write current value can be decreased to about 0.1 mA by setting the magnetic volume ratio to about 0.1. This makes it possible to arrange, e.g., a write selector transistor in a magnetic random access memory and decrease disturbs (write errors in half-selected cells). Even if a write selector transistor is arranged within the chip, the size (channel width) is as very small as about 0.1 $\mu$m, and a practical chip size can be realized.

The experimental results show that the write pass rate (write reproducibility) greatly increases at a magnetic volume ratio of 0.9 or less, or 0.3 or less.

At a magnetic volume ratio around 1, the write pass rate slightly exceeds 80%. When the magnetic volume ratio is set to 0.9 or less, the write pass rate abruptly increases to about 95%. Further, when the magnetic volume ratio is set to 0.3 or less, the write pass rate reaches almost 100%.

The write pass rate increases because the magnetization of the yoke material 8 is oriented to a direction in which the write line 5 runs, as shown in FIGS. 15 and 16. That is, the remanent magnetization of the yoke material 8 is always oriented to a direction in which the wiring line extends. The magnetic permeability of the yoke material can be increased to about 1,000 in subsequent write.

In this manner, the embodiments of the present invention can increase the write efficiency by an order or more of magnitude in comparison with the prior art. That is, the write current value can be decreased to 1 mA or less, or to 0.1 mA or less. The write pass rate (write reproducibility) can ensure about 95% by setting the magnetic volume ratio to 0.9 or less, and can reach almost 100% by setting the magnetic volume ratio to 0.3 or less.

In addition, the following points were confirmed by experiments.

When the magnetization direction of the recording layer of the MTJ element coincides with the magnetization direction of the yoke material (parallel state), the stray magnetic field assists exchange coupling, further decreasing the write current value to 0.05 mA or less. When the magnetization direction of the recording layer of the MTJ element is opposite to the magnetization direction of the yoke material (antiparallel state), the write current value can be decreased to 0.1 mA or less, and the disturbance to the magnetic field from outside the chip can be prevented.

When the magnetization direction of the recording layer of the MTJ element is perpendicular to the magnetization direction of the yoke material, an increase in the magnetic permeability of the yoke material (magnetic layer) and a decrease in write current can be achieved.

With an arrangement in which heat is generated near the MTJ element by the write current, the write current value can be decreased to 0.05 mA or less.

12. Others

The embodiments of the present invention can also be applied to a write line arranged immediately above an MTJ element. More specifically, the write line arranged immediately above the MTJ element is covered with a yoke material, and the recording layer of the MTJ element is exchange-coupled to the yoke material. The total magnetic volume $\Sigma Ms_i \times t_i$ of the recording layer of the MTJ element and a portion of the yoke material that is exchange-coupled to the MTJ element may be set smaller than the magnetic volume $\Sigma Ms_i' \times t_i'$ of the remaining portion of the yoke material that covers the write line arranged immediately above the MTJ element.

The embodiments of the present invention can also be applied to a case wherein the write line covered with the yoke material is not electrically connected to a conductive material (magnetic material). In other words, the MTJ element and write line may be insulated by an insulating material.

The shape of the MTJ element is not particularly limited in an application of the embodiments of the present invention. For example, the length of one side of the MTJ element may be set substantially equal to the width of the write line.

The structures according to the first to eighth embodiments can be singly used, or two or more of them may be combined and used.

13. Summary

As has been described above, the embodiments of the present invention can simultaneously realize a small write current by increasing the write efficiency, and high write reproducibility free from any write error.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:

a memory cell having a first magnetic layer to record data;

a write line including a function which applies a magnetic field to the first magnetic layer; and a second magnetic layer which covers all or part of the write line, wherein the first magnetic layer is exchange-coupled to the second magnetic layer, and a sum of a first magnetic volume $Ms1 \times t1$ of the first magnetic layer and a second magnetic volume $Ms2 \times t2$ of a first portion of the second magnetic layer that is exchange-coupled to the first magnetic layer is smaller than a third magnetic volume $Ms' \times t'$ of a second portion of the second magnetic layer except the first portion (where $Ms1$ is saturation magnetization of the first magnetic layer, $t1$ is a thickness of the first magnetic layer, $Ms2$ is saturation magnetization of the first portion of the second magnetic layer, $t2$ is a thickness of the first portion of the second magnetic layer, $Ms'$ is saturation magnetization of the second portion of the second magnetic layer, and $t'$ is a thickness of the second portion of the second magnetic layer).

2. The memory according to claim 1, wherein a quotient of dividing the sum of the first and second magnetic volumes by the third magnetic volume is not more than 0.9.

3. The memory according to claim 1, wherein a quotient of dividing the sum of the first and second magnetic volumes by the third magnetic volume is not more than 0.3.

4. The memory according to claim 1, wherein magnetization of the second magnetic layer is oriented in a direction of length of the write line.

5. The memory according to claim 4, wherein magnetization of the first magnetic layer is oriented in a direction of width of the write line.

6. The memory according to claim 5, wherein a write current having a direction depending on a write data value flows through the write line.

7. The memory according to claim 4, wherein magnetization of the first magnetic layer is oriented in the direction of length of the write line.

8. The memory according to claim 7, wherein a write current having always one direction flows through the write line.

9. The memory according to claim 1, wherein the second magnetic layer is higher in magnetic permeability than the first magnetic layer.

10. The memory according to claim 1, wherein the second magnetic layer is higher in saturation flux density than the first magnetic layer.

11. A magnetic random access memory comprising:

a memory cell having a first magnetic layer to record data;

a write line including a function which applies a magnetic field to the first magnetic layer; and a second magnetic layer which covers all or part of the write line, wherein the first magnetic layer is exchange-coupled to the second magnetic layer, and a thickness of a first portion of the second magnetic layer that is exchange-coupled to the first magnetic layer is set smaller than a thickness of a second portion of the second magnetic layer except the first portion.

12. The memory according to claim 11, wherein the write line is connected to a write selector transistor to select the memory cell in write mode.

13. The memory according to claim 11, wherein a nonmagnetic layer is interposed between the first and second magnetic layers.

14. The memory according to claim 13, wherein the nonmagnetic layer is formed from Ru.

15. The memory according to claim 11, wherein the first magnetic layer is arranged above the write line.

16. The memory according to claim 15, wherein the second magnetic layer covers at least a side or lower surface of the write line.

17. The memory according to claim 11, wherein the second magnetic layer is arranged only near the memory cell.

18. The memory according to claim 11, wherein a layered structure of the first portion of the second magnetic layer is the same as a layered structure of the second portion of the second magnetic layer.

19. The memory according to claim 11, wherein a material which forms the first portion of the second magnetic layer is the same as a material which forms the second portion of the second magnetic layer.

20. The memory according to claim 11, wherein the first magnetic layer is heated by a write current flowing through the write line in write mode.

21. The memory according to claim 11, wherein magnetization of the second magnetic layer is oriented in a direction of length of the write line.

22. The memory according to claim 21, wherein magnetization of the first magnetic layer is oriented in a direction of width of the write line.

23. The memory according to claim 22, wherein a write current having a direction depending on a write data value flows through the write line.

24. The memory according to claim 21, wherein magnetization of the first magnetic layer is oriented in the direction of length of the write line.

25. The memory according to claim 24, wherein a write current having always one direction flows through the write line.

26. The memory according to claim 11, wherein the second magnetic layer is higher in magnetic permeability than the first magnetic layer.

27. The memory according to claim 11, wherein the second magnetic layer is higher in saturation flux density than the first magnetic layer.

28. The memory according to claim 11, wherein the first magnetic layer is exchange-coupled to the second magnetic layer on lower and side surfaces.

* * * * *